United States Patent
Furukawa (10) Patent No.: US 7,395,480 B2
(45) Date of Patent: Jul. 1, 2008

(54) TEST APPARATUS AND TEST METHOD

(75) Inventor: Yasuo Furukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 308 days.

(21) Appl. No.: 11/398,917

(22) Filed: Apr. 6, 2006

(65) Prior Publication Data

US 2006/0248416 A1    Nov. 2, 2006

(30) Foreign Application Priority Data

Apr. 12, 2005   (JP)   ............... 2005-114543

(51) Int. Cl.
   *G06F 11/00*   (2006.01)
(52) U.S. Cl. .............. 714/745; 714/55; 714/721
(58) Field of Classification Search ........... 324/765, 324/617; 365/189.02; 714/724, 725, 734, 714/745, 55, 721; 716/4
   See application file for complete search history.

(56) References Cited

U.S. PATENT DOCUMENTS

| | | | | |
|---|---|---|---|---|
| 6,369,601 B1 * | 4/2002 | Ishigaki | ............... | 324/765 |
| 6,657,901 B2 * | 12/2003 | Kajigaya et al. | ........ | 365/189.02 |
| 6,725,404 B1 * | 4/2004 | Choudhury et al. | ......... | 714/724 |
| 6,828,799 B2 * | 12/2004 | Higashide et al. | ........... | 324/617 |
| 6,873,171 B2 * | 3/2005 | Reynick | ............... | 324/765 |
| 7,039,842 B1 * | 5/2006 | Whitten et al. | .............. | 714/725 |
| 7,216,311 B2 * | 5/2007 | Tanaka et al. | .................. | 716/4 |
| 2006/0190790 A1 * | 8/2006 | Pilling et al. | ................ | 714/734 |

OTHER PUBLICATIONS

J.P. Hurst, N. Kanopoulos, "Flip-Flop Sharing in Standard Scan Path to Enhance Delay Fault Testing of Sequential Circuits", Asian Test Symposium, Nov. 23, 1995, IEEE, pp. 346-352.
K. Hatayama, M. Ikeda, M. Takaura, S. Uchiyama, Y. Sakamoto, "Application of a Design for Delay Testability Approach to High Speed Logic LSIs", Asian Test Symposium, Nov. 17, 1997, IEEE, pp. 112-115.

(Continued)

*Primary Examiner*—David Ton
(74) *Attorney, Agent, or Firm*—Osha Liang LLP (57) ABSTRACT

The present invention provides a test apparatus comprising: a threshold voltage setting unit for setting threshold voltages of a logic device component connected to the signal propagation path; a test signal supply unit for supplying a test signal to the test subject device so as to operate the logic device component provided to the signal propagation path in a state in which the threshold voltages have been set to first threshold voltages, and in a state in which the threshold voltages have been set to second threshold voltages, by the threshold voltage setting unit; a current measurement unit, for measuring a first operating current which is the current consumption of the test subject device in a case in which the logic device component operates in a state in which the first threshold voltages have been set, and for measuring a second operating current which is the current consumption of the test subject device in a case in which the logic device component operates in a state in which the second threshold voltages have been set; and an acceptability determination unit for determining whether or not the signal propagation path is acceptable, based upon the first operating current and the second operating current.

10 Claims, 6 Drawing Sheets

OTHER PUBLICATIONS

N.A. Touba, E.J. McCluskey, "Applying Two-Pattern Tests Using Scan-Mapping", IEEE VLSI Test Symposium 1996, Apr. 28, 1996, IEEE pp. 393-397.

Eric McDonald, N.A. Touba, "Delay Testing of SOI Circuits: Challenges with the History Effect", International Test Conference 1999, Sep. 27, 1999, IEEE, pp. 269-275.

Hiroyuki Mizuno, "Increase of Leak Current Accompanying Low Voltage and High-Speed of CMOS LSI and a Technique for Reducing the Leak Current", The Transactions of the Institute of Electronics, Information and Communication Engineers, vol. J83-C, No. 10, Oct. 2000, pp. 926-935.

* cited by examiner

TEST APPARATUS AND TEST METHOD

CROSS REFERENCE TO RELATED APPLICATION

The present application claims priority from a Japanese Patent Application No. 2005-114543 filed on Apr. 12, 2005, the contents of which are incorporated herein by reference.

BACKGROUND OF THE INVENTION

1. Field of the Invention

The present invention relates to a test apparatus and test method. In particular, the present invention relates to a test apparatus and test method for detecting delay faults of a circuit.

2. Related Art

In recent years, improved fine processing technology for LSIs has promoted reduction in the size of logic device components included within LSIs. This leads to reduction in the driving performance of the logic device components, resulting in delay faults of the logic device components, which are the primary factor involved in faults of these logic device components.

Non-Patent Documents 1 through 4 listed below disclose scan methods in which high-speed switching of the test pattern, from that at a predetermined cycle to that at another cycle, is performed in order to perform a scan test regarding whether or not delay faults have occurred.

With the methods disclosed in Non-Patent Documents 1 through 4, the clock interval of adjacent clocks (double clocks) is controlled in order to test whether or not a circuit operates properly. This enables detection to be made regarding whether or not the circuit operates within a predetermined delay time.

(1) Non-Patent Document 1
J. P. Hurst, N. Kanopoulos, "Flip-Flop Sharing in Standard Scan Path to Enhance Delay Fault Testing of Sequential Circuits", Asian Test Symposium, Nov. 23, 1995, IEEE, pp. 346-352.

(2) Non-Patent Document 2
K. Hatayama, M. Ikeda, M. Takakura, S. Uchiyama, Y. Sakamoto, "Application of a Design for Delay Testability Approach to High Speed Logic LSIs", Asian Test Symposium, Nov. 17, 1997, IEEE, pp. 112-115.

(3) Non-Patent Document 3
N. A. Touba, E. J. McCluskey, "Applying Two-Pattern Tests Using Scan-Mapping", IEEE VLSI Test Symposium 1996, Apr. 28, 1996, IEEE, pp. 393-397.

(4) Non-Patent Document 4
Eric MacDonald, N. A. Touba, "Delay Testing of SOI Circuits: Challenges with the History Effect", International Test Conference 1999, Sep. 27, 1999, IEEE, pp. 269-275.

(5) Non-Patent Document 5
Hiroyuki Mizuno, "Increase of Leak Current Accompanying Low voltage and High-Speed of CMOS LSI and a Technique for Reducing the Leak Current", The Transactions of the Institute of Electronics, Information and Communication Engineers, Vol. J83-C, No. 10, October 2000, pp. 926-935.

With the above-described test using such a double clock, delay faults are detected by controlling the clock interval. However, there are limits to the precision with which the clock interval can be set. This leads to difficulty in fine detection of delay faults.

Also, with the above-described test which uses such a double clock, the absolute value of the delay time is measured for the circuit, and determination is made whether or not the LSI is acceptable based upon the absolute value thus measured.

Accordingly, such methods have the disadvantage that determination cannot be made whether the delay thus measured is due to irregularities in the operations of the logic device components or due to delay faults of a particular logic device component.

SUMMARY OF THE INVENTION

Accordingly, it is an object of the present invention to provide a test apparatus and a test method which are capable of solving the aforementioned problems. This object is achieved by combining the features described in the independent claims in the Claims. Also, the dependent claims lay forth further advantageous specific examples of the present invention.

According to a first aspect of the present invention, a test apparatus for testing whether or not delay faults have occurred in a signal propagation path included within a test subject device, comprises: a threshold voltage setting unit for setting threshold voltages of a logic device component connected to the signal propagation path; a test signal supply unit for supplying a test signal to the test subject device so as to operate logic device component provided to the signal propagation path in a state in which the threshold voltages have been set to first threshold voltages, and in a state in which the threshold voltages have been set to second threshold voltages, by the threshold voltage setting unit; a current measurement unit, for measuring a first operating current which is the current consumption of the test subject device in a case in which the logic device component operates in a state in which the first threshold voltages have been set, and for measuring a second operating current which is the current consumption of the test subject device in a case in which the logic device component operates in a state in which the second threshold voltages have been set; and an acceptability determination unit for determining whether or not the signal propagation path is acceptable, based upon the first operating current and the second operating current.

The threshold voltage setting unit may change and set the substrate voltages of FETs (field effect transistors) included in the logic device component, thereby changing and setting the threshold voltages of the logic device component.

The threshold voltage setting unit may set the first threshold voltage and the second threshold voltages such that the absolute value of the difference between a level voltage, which is a signal input to the logic device component, and the second threshold voltage, is smaller than the absolute value of the difference between the level voltage and the first threshold voltage. With such an arrangement, in a case that the difference obtained by subtracting the first operating current from the second operating current is greater than a predetermined reference value, the acceptability determination unit may determine that the signal propagation path is unacceptable.

The threshold voltage setting unit may set the first threshold voltage to be the voltage used in the normal operation of the subject test device, and may set the second threshold voltage such that the absolute value of the difference between a level voltage, which is a signal input to the logic device component, and the second threshold voltage, is smaller than that in the normal operation.

Alternatively, the threshold voltage setting unit may set the second threshold voltage to be the voltage used in the normal operation of the subject test device, and may set the first threshold voltage such that the absolute value of the difference between a level voltage, which is a signal input to the logic device component, and the first threshold voltage, is smaller than that in the normal operation.

The current measurement unit may further measure a first quiescent current, which is the current consumption of the test subject device in a case that the logic device component does not operate in a state in which the first threshold voltages have been set, and a second quiescent current which is the current consumption of the test subject device in a case that the logic device component does not operate in a state in which the second threshold voltages have been set. With such an arrangement, the acceptability determination unit may determine whether or not the signal propagation path is acceptable, based upon the difference between a first current difference, which is obtained by subtracting the first quiescent current from the first operating current, and a second current difference, which is obtained by subtracting the second quiescent current from the second operating current.

The threshold voltage setting unit may set the first threshold voltage and the second threshold voltage such that the absolute value of the difference between a level voltage, which is a signal input to the logic device component, and the second threshold voltage, is smaller than the absolute value of the difference between the level voltage and the first voltage. With such an arrangement, in a case that the difference obtained by subtracting the first current difference from the second current difference is greater than a predetermined value, the acceptability determination unit may determine that the signal propagation path is unacceptable.

The test signal supply unit may supply the test signal to the test subject device so as to operate the logic device component at a first frequency. With such an arrangement, the threshold voltage setting unit may vary the threshold voltages at a second frequency. Furthermore, the acceptability determination unit determines whether or not the signal propagation path is acceptable, based upon the amplitude of the frequency component of the fluctuation of the current consumption of the test subject device at a frequency corresponding to the second frequency.

The acceptability determination unit may determine whether or not the signal propagation path is acceptable, based upon at least one of the amplitude of the frequency component of the fluctuation of the current consumption of the test subject device at a frequency obtained by adding the second frequency to the first frequency, and the amplitude of the frequency component thereof at a frequency obtained by subtracting the second frequency from the first frequency.

The threshold voltage setting unit may vary the threshold voltages of each of multiple logic device components provided corresponding to multiple signal propagation paths included within the test subject device, at second frequencies which differ from one another. With such an arrangement, in a case that a particular frequency component in the frequency spectrum of the fluctuation of the current consumption of the test subject device is greater than a predetermined reference value, the acceptability determination unit may determine that a particular one of the multiple signal propagation paths, where the frequency of the frequency component matches the sum of the first frequency and the second frequency, at which the threshold voltages of the logic device component corresponding to the signal propagation path have been varied, or the difference obtained by subtracting the second frequency from the first frequency, is unacceptable.

According to a second aspect of the present invention, a test method for testing whether or not delay faults have occurred in a signal propagation path included within a test subject device, comprises: a threshold voltage setting step for setting threshold voltages of a logic device component connected to the signal propagation path; a test signal supply step for supplying a test signal to the test subject device so as to operate the logic device component provided to the signal propagation path in a state in which the threshold voltages have been set to first threshold voltages, and in a state in which the threshold voltages have been set to second threshold voltages, by the threshold voltage setting unit; a current measurement step, for measuring a first operating current which is the current consumption of the test subject device in a case in which the logic device component operates in a state in which the first threshold voltages have been set, and for measuring a second operating current which is the current consumption of the test subject device in a case in which the logic device component operates in a state in which the second threshold voltages have been set; and an acceptability determination step for determining whether or not the signal propagation path is acceptable, based upon the first operating current and the second operating current.

Note that the above overview of the invention is not a comprehensive listing of all essential features of the present invention, and that sub-combinations of these feature groups may also be encompassed by the invention.

DETAILED DESCRIPTION OF THE INVENTION

The present invention will now be described by way of embodiments; however, it should be understood that the following embodiments do not restrict the invention according to the Claims, and that combinations of features described in the embodiments are not necessarily indispensable to the present invention.

Figure 1:
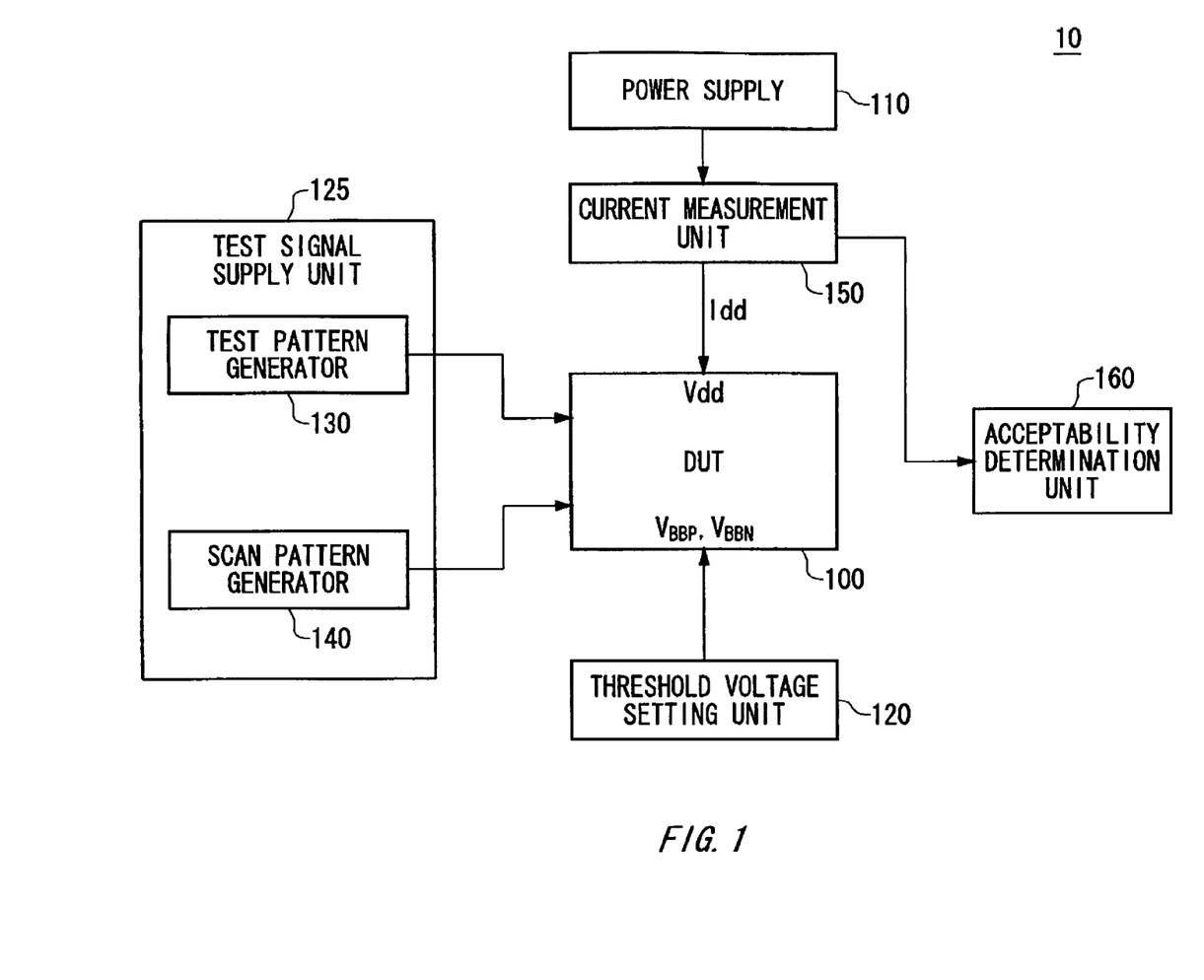
FIG. 1 shows the configuration of a test apparatus 10 according to an embodiment of the present invention.

FIG. 1 shows the configuration of a test apparatus 10 together with a DUT 100, according to an embodiment of the present invention. The DUT (device under test) 100 is an IC, LSI, or the like, for example. The DUT 100 includes multiple logic device components and multiple signal transmission pathsignal propagation paths which connect the logic device components or input/output terminals. The test apparatus 10 tests whether or not delay faults occur in the signal propagation paths within the DUT 100, thereby detecting whether or not faults have occurred.

With the test apparatus 10 according to the present embodiment, the threshold voltages of a logic device component on the signal transmission pathsignal propagation path are changed, and whether or not delay faults have occurred is tested based upon change in the operating current of the DUT 100 due to the change in this threshold voltages. The test apparatus 10 includes a power supply 110, a threshold voltage setting unit 120, a test signal supply unit 125, a current measurement unit 150, and an acceptability determination unit 160.

The power supply 110 outputs source voltage Vdd, which is supplied to the DUT 100. The threshold voltage setting unit 120 sets the threshold voltage of a logic device component connected to a signal transmission pathsignal propagation path within the DUT 100. With the present embodiment, the threshold voltage setting unit 120 sets and changes the substrate voltage of FETs (field effect transistors) included in a logic device component within the DUT 100, which will simply be referred to as "substrate voltage". This enables the threshold voltage of the logic device components to be set and threshold voltage due to change in the substrate voltage. Non-patent Document 5 discloses that the threshold voltages varies when the substrate voltage is changed.

With the present embodiment, the threshold voltage setting unit 120 sets the substrate voltage of the FETs included in the logic device component to a first substrate voltage, thereby setting a first threshold voltage of the FETs included within the logic device component. Also, the threshold voltage setting unit 120 sets the substrate voltage of the FETs included in the logic device component to a second substrate voltage, thereby setting a second threshold voltage of the FETs included within the logic device component.

With the threshold voltage setting unit 120 according to the present embodiment, the substrate voltage of the FETs is set to the first substrate voltage which is used in the normal operation of the circuit, thereby setting the first threshold voltage as the voltage which is the same as that used in the normal operation of the FETs.

Also, the threshold voltage setting unit 120 sets the substrate voltage of the FETs to the second substrate voltage, which differs from the substrate voltage used in the normal operation of the circuit, thereby setting the second threshold voltage as the voltage which differs from that used in the normal operation of the FETs.

Instead of the aforementioned arrangement, the threshold voltage setting unit 120 may set the substrate voltage of the FETs to a first substrate voltage which differs from the substrate voltage used in the normal operation of the circuit, thereby setting the first threshold voltage as the voltage which differs from that used in the normal operation of the FETs. With such an arrangement, the threshold voltage setting unit 120 may set the substrate voltage of the FETs to the second substrate voltage which is the same as that used in the normal operation of the circuit, thereby setting the second threshold voltage as the voltage which is the same as that used in the normal operation of the FETs.

Also, an arrangement may be made in which both the first substrate voltage and the second substrate voltage differ from the voltage used in the normal operation of the circuit.

The test signal supply unit 125 supplies a test signal to the signal terminal of the DUT 100 so as to set the internal state of the DUT 100, or so as to operate the DUT 100. The signal supply unit 125 includes a test pattern generator 130 and a scan pattern generator 140. The test pattern generator 130 generates a setting vector which is a test pattern for testing a test subject path, which is a test subject selected from among the paths included within the DUT 100. The test pattern generator 130 supplies the setting vector to the signal terminal of the DUT 100 as a test signal. Thus, the test pattern generator 130 sets the DUT 100 to be in a state in which the aforementioned test subject path can be tested. Furthermore, the test pattern generator 130 supplies a test signal to the DUT 100 so as to operate the logic device component provided on the signal transmission pathsignal propagation path that is included in the test subject path, in a state in which the first threshold voltage has been set by the threshold voltage setting unit 120, and in a state in which the second threshold voltage has been set by the threshold voltage setting unit 120.

The scan pattern generator 140 generates a scan pattern used for a test of delay faults, and supplies the scan pattern to the scan terminal of the DUT 100. Thus, the scan pattern generator 140 supplies the scan pattern to the DUT 100 while the test pattern generator 130 supplies the setting vector to the DUT 100, whereupon the DUT 100 is set to be in a state in which the test subject path can be tested.

The current measurement unit 150 measures the current supplied to the DUT 100 from the power supply 110, thereby measuring the current consumption of the DUT 100. The current measurement unit 150 according to the present embodiment measures a first operating current which is the consumption current of the DUT 100 in a case of operating the logic device component provided on the signal transmission pathsignal propagation path in the state in which the first threshold voltage has been set. Also, the current measurement unit 150 measures a second operating current which is the consumption current of the DUT 100 in a case of operating the logic device component provided on the signal transmission pathsignal propagation path in the state in which the second threshold voltage has been set.

The acceptability determination unit 160 determines whether or not the signal transmission pathsignal propagation path, which is a test subject, is acceptable, based upon the first operating current and the second operating current.

Figure 2:
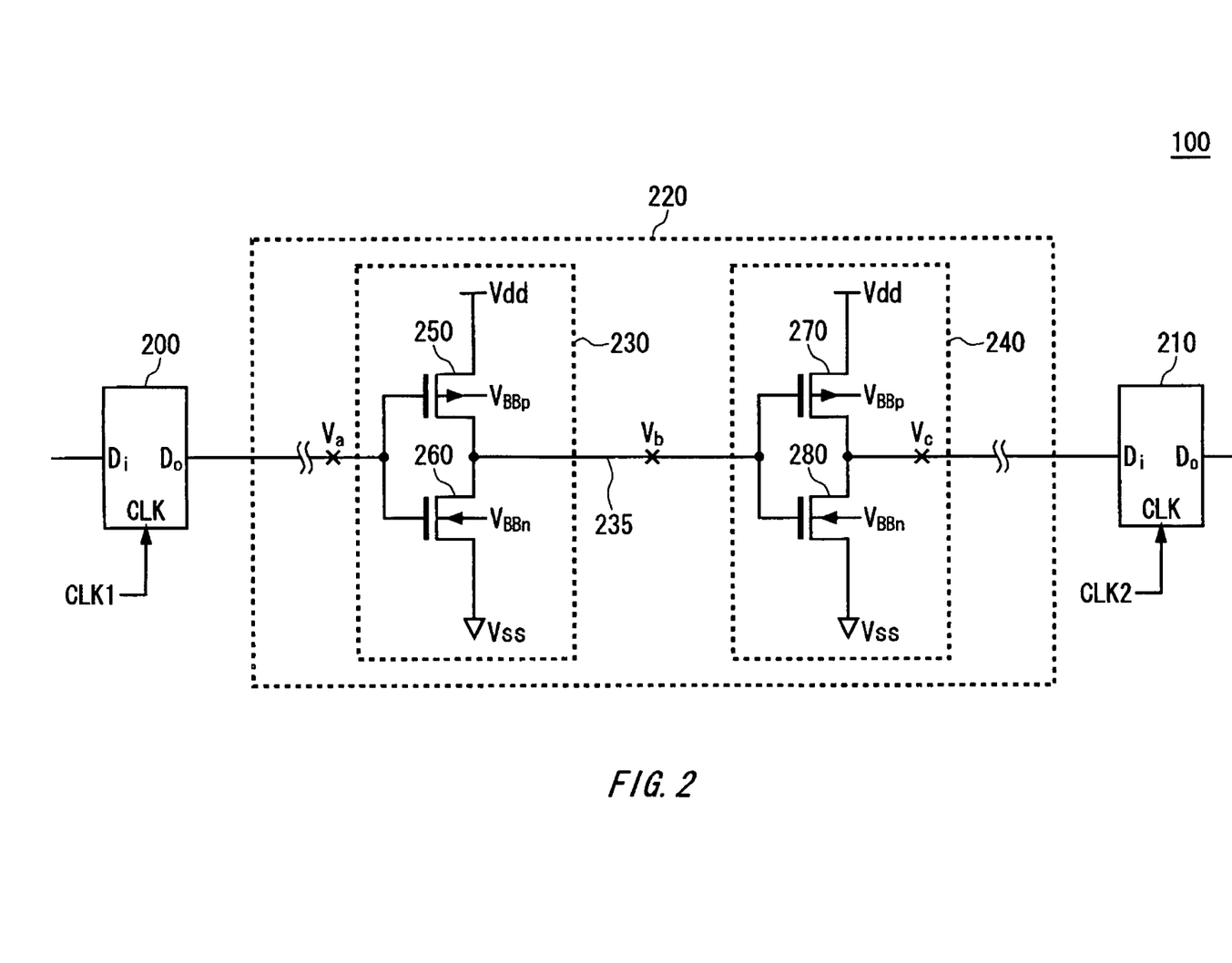
FIG. 2 shows an example of the configuration of a DUT 100 according to the embodiment of the present invention.

FIG. 2 shows an example of the configuration of the DUT 100 according to the embodiment of the present invention. The DUT 100 includes multiple flip-flops (FF 200, FF 210), and multiple combinational circuits provided between the upstream flop-flip and the downstream flip-flop. Description will be made in the present embodiment regarding an arrangement in which a test is performed for the logic path including the FF 200, the FF 210, and a circuit 220 provided between the FF 200 and the FF 210, which is a typical example of the multiple logic paths included within the DUT 100. In particular, description will be made regarding an arrangement in which a test is performed for a signal propagation path 235 provided between the upstream logic device component 230 and the downstream logic device component 240, which are connected in series.

The FF 200 acquires the level voltage of the input Di at the rising timing of the clock signal CLK 1, and outputs this signal as the output Do. The FF 210 acquires the level signal of the input Di at the rising timing of the clock signal CLK 2, and outputs this signal as the output Do.

The circuit 220 is a combinational circuit having a function of inputting a level signal to the terminal Di of the FF 210 based upon the signal Do received from the FF 200.

More specifically, the circuit 220 performs desired logic computation or the like based upon the signal input from the FF 200, and outputs the level voltage, which indicates the logic value resulting from the logic computation or the like, to the FF 210.

The circuit 220 has a configuration in which logic device components such as AND, NAND, OR, NOR, EXOR, NOT, etc., are connected in series. In an example shown in the drawing, the circuit 220 includes the upstream logic device component 230, which outputs a first level voltage (e.g., the voltage representing the logic high value) or a second level voltage (e.g., the voltage representing the logic low voltage), and the downstream logic device component 240 which is connected downstream of the upstream logic device component 230 through the signal propagation path 235, and which receives the output signal of the upstream logic device component 230.

The upstream logic device component 230 includes an upstream P-channel FET 250 and a downstream N-channel FET 260. The upstream P-channel FET 250 is a MOS FET in which the source thereof is connected to the power-supply side with respect to the output signal, and the drain thereof is connected to the output-signal side with respect to the source thereof. The upstream N-channel FET 260 is a MOS FET in which the source thereof is connected to the ground side with respect to the output signal, and the drain thereof is connected to the output-signal side with respect to the source thereof.

The upstream logic device component 230 serves as an inverter. Note that the upstream logic device component 230 may further include one or more P-channel FETs between the upstream P-channel FET 250 and the power supply, or between the upstream P-channel FET 250 and the output signal terminal. Also, the upstream logic device component 230 may further include one or more N-channel FETs between the upstream N-channel FET 260 and the ground, or between the upstream N-channel FET 260 and the output signal terminal. With such an arrangement, the upstream logic device component 230 serves as a logic device such as AND, NAND, NOR, EXOR, or the like.

The downstream logic device component 240 receives the output signal of the upstream logic device component 230 through the gate terminal. The downstream logic device component 240 includes a downstream P-channel FET 270 and a downstream N-channel FET 280, which output a level voltage that changes according to whether or the output signal voltage thus received is greater than or smaller than the threshold voltage. The downstream logic device component 240 has the same configuration as that of the upstream logic device component 230. Specifically, the upstream P-channel FET 250 corresponds to the downstream P-channel FET 270. On the other hand, the upstream N-channel FET 260 corresponds to the downstream N-channel FET 280. Accordingly, description thereof will be omitted, except for the following points of difference.

Figure 3A:
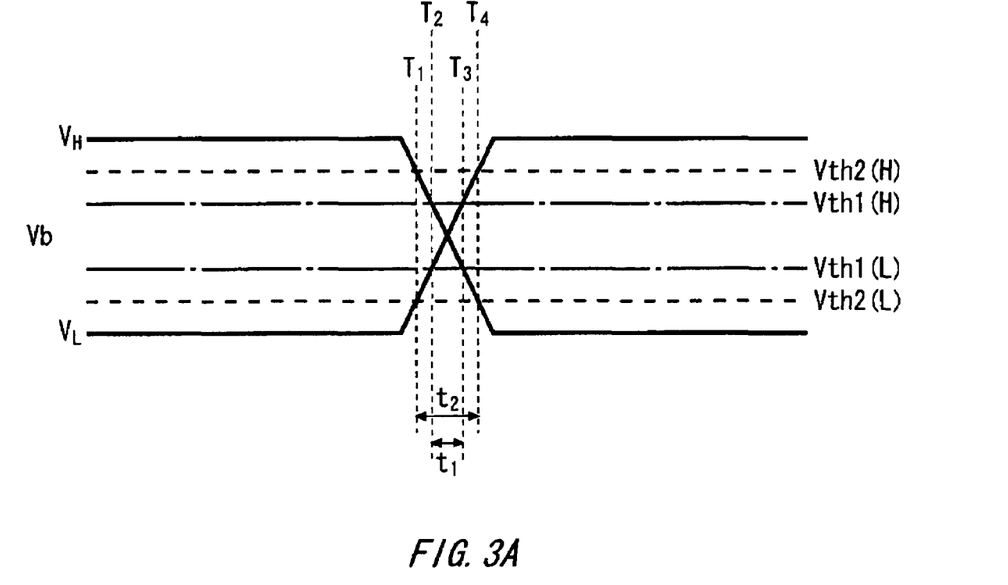
FIG. 3A shows the normal operation of a signal propagation path 235 included in the DUT 100 according to the embodiment of the present invention.
Figure 3B:
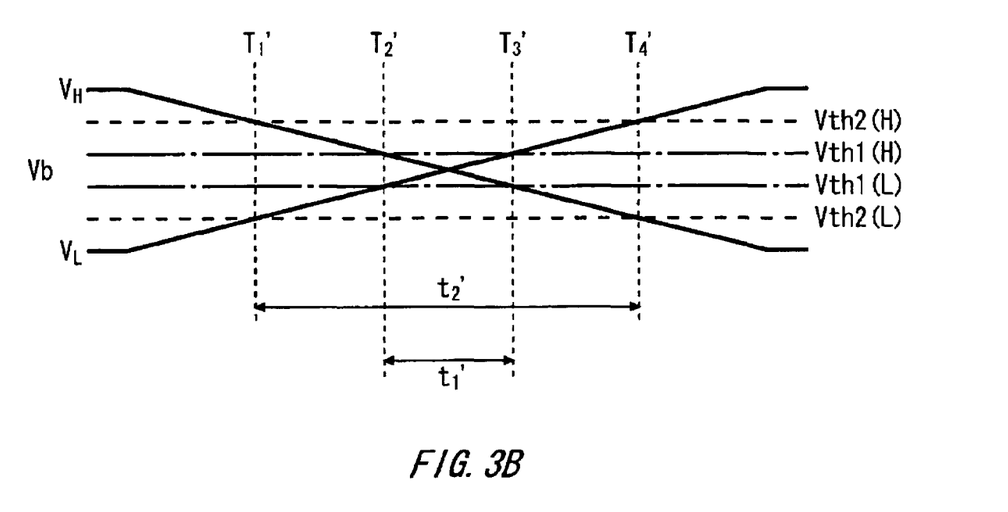
FIG. 3B shows the abnormal operation of the signal propagation path 235 included in the DUT 100 according to the embodiment of the present invention.

FIG. 3A and FIG. 3B show the operations of the DUT 100 according to the embodiment of the present invention. FIG. 3A shows the voltage Vb which is a signal received by the downstream logic device component 240 during the normal operation of the signal propagation path 235.

Let us say that the threshold voltage of the downstream P-channel FET 270 is set to a first positive threshold voltage Vth1 (H), and the threshold voltage of the downstream N-channel FET 280 is set to a first negative threshold voltage Vth1 (L). First, description will be made regarding the operation of the DUT 100 under such conditions in a case of the voltage Vb falling from the voltage VH, which represents the logic high level, to the voltage VL, which represents the logic low level.

With such an arrangement, upon the voltage Va input to the upstream logic device component 230 being switched from the logic low level to the logic high level, the voltage Vb, which is the output signal of the upstream logic device component 230, falls from the logic high level to the logic low level.

In this step, upon the voltage Vb becoming smaller than the threshold voltage Vth1(H) of the downstream P-channel FET 270, the downstream P-channel FET 270 switches from the OFF state to the ON state (point in time T2). As a result, the voltage Vc, which is the output of the downstream logic device component 240, starts to switch from VL to VH. Furthermore, upon the voltage Vb becoming smaller than the threshold voltage Vth1(L) of the downstream N-channel FET 280, the downstream N-channel FET 280 switches from the ON state to the OFF state, whereupon the voltage Vc becomes VH (point in time T3). Accordingly, both the downstream P-channel FET 270 and the downstream N-channel FET 280 are set to the ON state during the period of time from the point in time T2 to the point in time T3. This leads to the through current flowing from the power supply Vdd to the ground Vss during this period.

Next, description will be made regarding the operation of the DUT 100 in a case that the voltage Vb rises from the voltage VL representing the logic low level to the voltage VH representing the logic high level. With such an arrangement, upon the voltage Va input to the upstream logic device component 230 being switched from the logic high level to the logic low level, the voltage Vb, which is the output signal of the upstream logic device component 230, rises from the logic low level to the logic high level.

In this step, upon the voltage Vb becoming greater than the threshold voltage Vth1(L) of the downstream N-channel FET 280, the downstream N-channel FET 280 switches from the OFF state to the ON state (point in time T2). As a result, the voltage Vc, which is the output of the downstream logic device component 240, starts to switch from VH to VL. Furthermore, upon the voltage Vb becoming greater than the threshold voltage Vth1(H) of the downstream P-channel FET 270, the downstream P-channel FET 270 switches from the ON state to the OFF state, whereupon the voltage Vc becomes VL (point in time T3). Accordingly, both the downstream P-channel FET 270 and the downstream N-channel FET 280 are set to the ON state during the period of time t2 from the point in time T2 T1 to the point in time T3. This leads to the through current flowing from the power supply Vdd to the ground Vss during this period of time.

With such an arrangement, let us consider a case in which the threshold voltage of the downstream P-channel FET 270 is set to a second positive threshold voltage Vth2(H) that is lower than the first positive threshold voltage Vth1(H), and the threshold voltage of the downstream N-channel FET 280 is set to a second negative threshold voltage Vth2(L) that is lower than the first negative threshold voltage Vth1(L). In such a case, both the downstream P-channel FET 270 and the downstream N-channel FET 280 are in the ON state during the period of time t1 t2 (>t2t1) from the point in time T1 to the point in time T4. Here, description will be made regarding a state in which the downstream P-channel FET 270 and the downstream N-channel FET 280 are set to lower values. In such a state, the threshold voltage of the downstream P-channel FET 270 is set to the second positive threshold voltage Vth2(H), and the downstream N-channel FET 280 is set to the second negative threshold voltage Vth2(L). With regard to the second positive threshold voltage Vth2(H), the absolute value of the difference between the second positive threshold voltage Vth2(H) and the level voltage VH which is input to the downstream logic device component 240 is lower than the absolute value of the difference between the first positive threshold voltage Vth1(H) and the level voltage VH. On the other hand, with regard to the second negative threshold voltage Vth2(L), the absolute value of the difference between the second negative threshold voltage Vth2(L) and the level voltage VL which is input to the downstream logic device component 240 is lower than the absolute value of the difference between the first negative threshold voltage Vth1(L) and the level voltage VL.

Let us consider a case in which the threshold voltages are set to values closer to the logic high level and the logic low level, respectively. In such a case, duration of the through current flowing via the downstream P-channel FET 270 and the downstream N-channel FET 280 becomes somewhat longer. However, in a normal state, the duration of the through current flowing via the downstream P-cannel FET 270 and the downstream N-channel FET 280 is around several tens of picoseconds, for example. Accordingly, the change in the duration of the through current flowing due to the change in the threshold voltage is small. Accordingly, the difference between the first operating current, which is measured by the current measurement unit 150 in a state in which the first threshold voltages Vth1(H) and Vth1(L) have been set, and the second operating current, which is measured by the current measurement unit 150 in a state in which the second threshold voltages Vth2(H) and Vth2(L) have been set, is relatively small.

FIG. 3B shows the voltage Vb, which is a signal received by the downstream logic device component 240, in a case that delay faults have occurred in the signal propagation path 235. In a case that delay faults have occurred in the signal propagation path 235, the downstream logic device component 240 receives the voltage Vb having a gently rising waveform and a gently falling waveform, as compared with the normal state. As a result, the period of time t1', which is the duration of the through current flowing via the downstream P-channel FET 270 and the downstream N-channel FET 280, in a state in which the first positive threshold voltage Vth1(H) and the first negative threshold voltage Vth1(L) have been set, is longer than the period of time t1 in the normal state. In the same way, the period of time t2', which is the duration of the through current flowing via the downstream P-channel FET 270 and the downstream N-channel FET 280, in a state in which the second positive threshold voltage Vth2(H) and the second negative threshold voltage Vth2(L) have been set, is longer than the period of time t2 in the normal state.

In a case that delay faults have occurred, duration of the through current flowing via the downstream P-channel FET 270 and the downstream N-channel FET 280 is several nanoseconds or more, for example. This leads to an extremely great change in the duration of the through current flowing due to the change in the threshold voltage, as compared with that in the normal state. Accordingly, there is a greater difference between the first operating current and the second operating current, which are measured by the current measurement unit 150, than that in the normal state.

Based upon the characteristics of the delay faults as described above, in a case that the difference obtained by subtracting the first operating current from the second operating current is greater than a predetermined value, the acceptability determination unit 160 determines that the signal transmission pathsignal propagation path, which is a test subject, is unacceptable. Thus, with the test apparatus 10, current consumption of the DUT 100 is measured instead of measurement of the delay time using a double clock method or the like, which enables delay faults to be properly detected.

Figure 4:
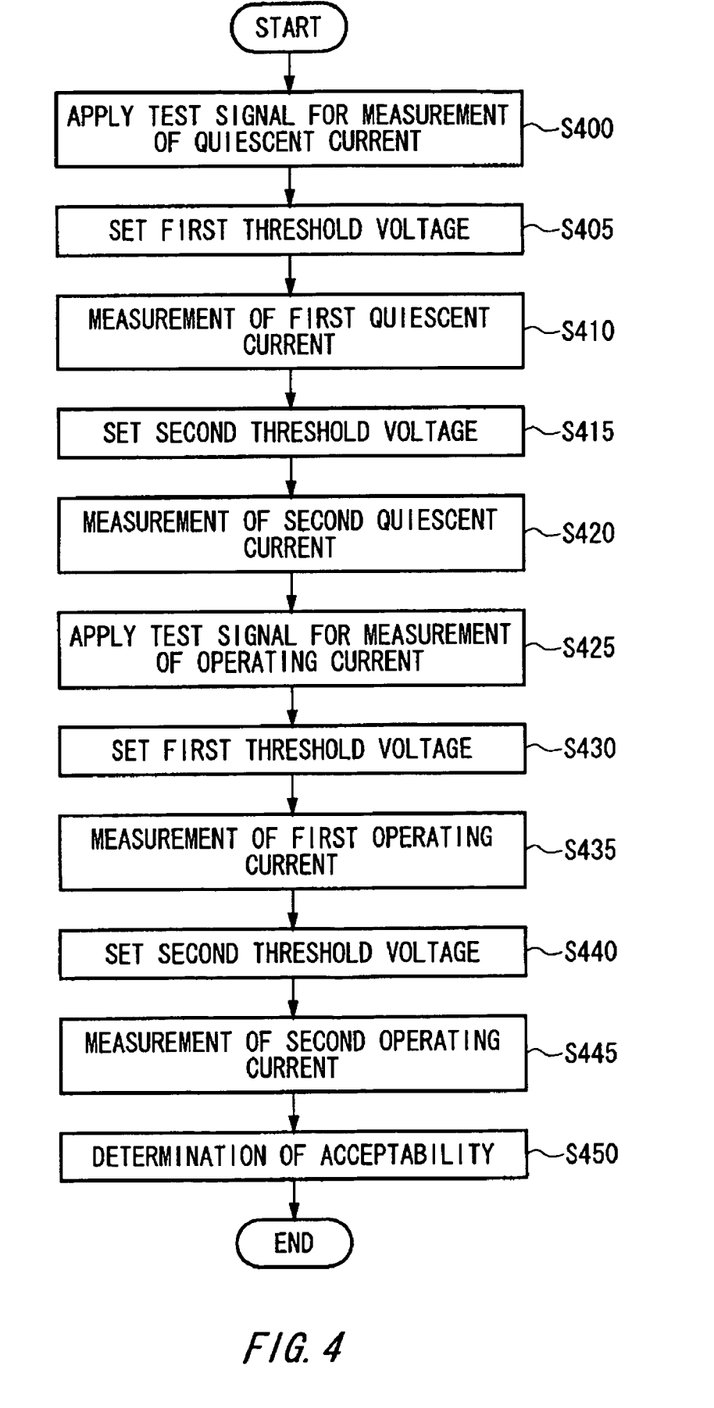
FIG. 4 shows the operation flow of the test apparatus 10 according to the embodiment of the present invention.

FIG. 4 shows the operating flow for the test apparatus 10 according to the embodiment of the present invention.

First, the test apparatus 10 measures first and second quiescent currents in order to improve the precision of acceptability determination. Here, the first quiescent current is the current consumption of the DUT 100 in a state in which the first threshold voltages have been set, and in a state in which the downstream logic device component 240 connected to the signal propagation path 235, which is a test subject, does not operate. On the other hand, the second quiescent current is the current consumption of the DUT 100 in a state in which the second threshold voltages have been set, and in a state in which the downstream logic device component 240 connected to the signal propagation path 235, which is a test subject, does not operate.

More specifically, the test signal supply unit 125 applies a test signal to the DUT 100 based upon a test pattern and/or a scan pattern for switching the internal state of the DUT 100 to that for measuring the quiescent current (S400). In this step, the DUT 100 enters the state in which the downstream logic device component 240 does not operate.

Next, the threshold voltage setting unit 120 sets the substrate voltage VBBp on the P-channel side and the substrate voltage VBBn on the N-channel side, which are supplied to the DUT 100, to a first P-channel substrate voltage VBBp1 and a first N-channel substrate voltage VBBn1, respectively (S405). In this step, the threshold voltages of the downstream P-channel FET 270 and the downstream N-channel FET 280 are set to the first positive threshold voltage Vth1(H) and the first negative threshold voltage Vth1(L). In this step, the threshold voltage setting unit 120 may set the first threshold voltages to be those used in the normal operation of the DUT 100.

Alternatively, the threshold voltage setting unit 120 may set the first threshold voltages such that the absolute value of the difference between the threshold voltage and the level voltage, which is a signal input to the downstream logic device component 240, is smaller than that which is used in the normal operation. Then, the current measurement unit 150 measures first quiescent current Iddq1, which is the current consumption of the DUT 100 in a state in which the downstream logic device component 240 does not operate, and in a state in which the first threshold voltages have been set by the threshold voltage setting unit 120 (S410).

Next, the threshold voltage setting unit 120 sets the substrate voltage VBBp on the P-channel side and the substrate voltage VBBn on the N-channel side, which are supplied to the DUT 100, to a second P-channel substrate voltage VBBp2 and a second N-channel substrate voltage VBBn2, respectively (S415). In this step, the threshold voltages of the downstream P-channel FET 270 and the downstream N-channel FET 280 are set to the second positive threshold voltage Vth2(H) and the second negative threshold voltage Vth2(L). In this step, the threshold voltage setting unit 120 may set the second threshold voltages such that the absolute value of the difference between the threshold voltage and the level voltage, which is a signal input to the downstream logic device component 240, is smaller than that which is used in the normal operation.

Alternatively, the threshold voltage setting unit 120 may set the second threshold voltages to be those used in the normal operation of the DUT 100.

Then, the current measurement unit 150 measures second quiescent current Iddq2, which is the current consumption of the DUT 100 in a state in which the downstream logic device component 240 does not operate, and in a state in which the second threshold voltages have been set by the threshold voltage setting unit 120 (S410S420).

Next, the test apparatus 10 measures first and second operating currents. Here, the first operating current is current consumption of the DUT 100 in a state in which the first threshold voltages have been set, and in a state in which the downstream logic device component 240 connected to the signal propagation path 235, which is a test subject, operates. On the other hand, the second operating current is current consumption of the DUT 100 in a state in which the second threshold voltages have been set, and in a state in which the downstream logic device component 240 connected to the signal propagation path 235, which is a test subject, operates.

More specifically, the test signal supply unit 125 applies a test signal to the DUT 100 based upon a test pattern and/or a scan pattern for switching the internal state of the DUT 100 to be that for measuring the operating current (S425). Then, the test signal supply unit 125 instructs the DUT 100 to start to operate, and repeatedly supplies a test signal to the DUT 100 so as to repeatedly switch the input voltage Vb which is to be input to the downstream logic device component 240 thereof.

Next, the threshold voltage setting unit 120 sets the threshold voltage of the downstream P-channel FET 270 and the threshold voltage of the downstream N-channel FET 280 to the first positive threshold voltage Vth1(H) and the first negative threshold voltage Vth1(L), respectively, in the same way as in Step S405 (S430). Then, the current measurement unit 150 measures first operating current Idd1, which is current consumption of the DUT 100 in a state in which the downstream logic device component 240, which is provided to the signal propagation path 235, operates, and in a state in which the first threshold voltages Vth1(H) and Vth1(L) have been set (S435).

Next, the threshold voltage setting unit 120 sets the threshold voltage of the downstream P-channel FET 270 and the threshold voltage of the downstream N-channel FET 280 to the second positive threshold voltage Vth2(H) and the second negative threshold voltage Vth2(L), respectively, in the same way as in Step S415 (S440). Then, the current measurement unit 150 measures the second operating current Idd2 which is the current consumption of the DUT 100 in a state in which the downstream logic device component 240, which is provided to the signal propagation path 235, operates, and in a state in which the second threshold voltages Vth2(H) and Vth2(L) have been set (S445).

Next, the acceptability determination unit 160 determines whether or not delay faults have occurred, based upon the first quiescent current Iddq1, the second quiescent current Iddq2, the first operating current Idd1, and the second operating current Idd2 (S450). More specifically, first, the acceptability determination unit 160 obtains the first current difference (Idd1−Iddq1) by subtracting the first quiescent current Iddq1 from the first operating current Idd1. Furthermore, the acceptability determination unit 160 obtains the second current difference (Idd2−Iddq2) by subtracting the second quiescent current Iddq2 from the second operating current Idd2. Then, the acceptability determination unit 160 determines whether or not the signal propagation path 235 is acceptable, based upon the first current difference and the second current difference. As an example, in a case that Ip which is the difference between the first current difference and the second current difference as represented by the following Expression (1), i.e., the difference Ipt, which is obtained by subtracting the first current difference from the second current difference, is greater than a predetermined reference value, determination is made that the signal propagation path 235 is unacceptable.

$$Ipt = |(Vdd2 - Vddq2) - (Vdd1 - Vddq1)| \qquad \text{Expression 1}$$

As described above, the acceptability determination unit 160 obtains the current difference by subtracting the quiescent current Iddq from the operating current Idd for each case, i.e., for a case of the first threshold voltages having been set, and a case of the second threshold voltages having been set.

This enables the acceptability determination unit 160 to obtain the current difference depending upon the through current, without other factors by canceling out the factors other than the through current that flows via the downstream logic device component 240 connected to the signal propagation path 235.

Then, the acceptability determination unit 160 obtains the difference Ipt in the current difference between cases of different threshold voltages having been set, thereby obtaining the difference in the through current due to change in the threshold voltage.

Thus, the acceptability determination unit 160 can determine whether or not delay faults have occurred, based upon the value of the Ipt, as described with reference to FIG. 3.

Note that the difference in the current between the operating current Idd and the quiescent current Iddq contains charge/discharge current f•C•Vdd. Here, with the capacitance of the signal propagation path 235 as C, and with the operating frequency as f, the charge/discharge current is approximately equal to f•C•Vdd, which is not dependent upon the threshold voltage Vth.

Accordingly, with the present embodiment, the difference Ipt between the first current difference and the second current difference is obtained from measurement during the operation at a constant frequency f, thereby canceling out the factor of the charge/discharge current due to the aforementioned capacitance.

With such an arrangement, the threshold voltage setting unit 120 may set the threshold voltages of the downstream logic device components 240 corresponding to multiple signal propagation paths 235 included in the DUT 100 all at the same time. This enables the test apparatus 10 to determine whether or not delay faults have occurred in at least one of the multiple signal propagation paths 235 based upon the results of the aforementioned test operation.

Figure 5:
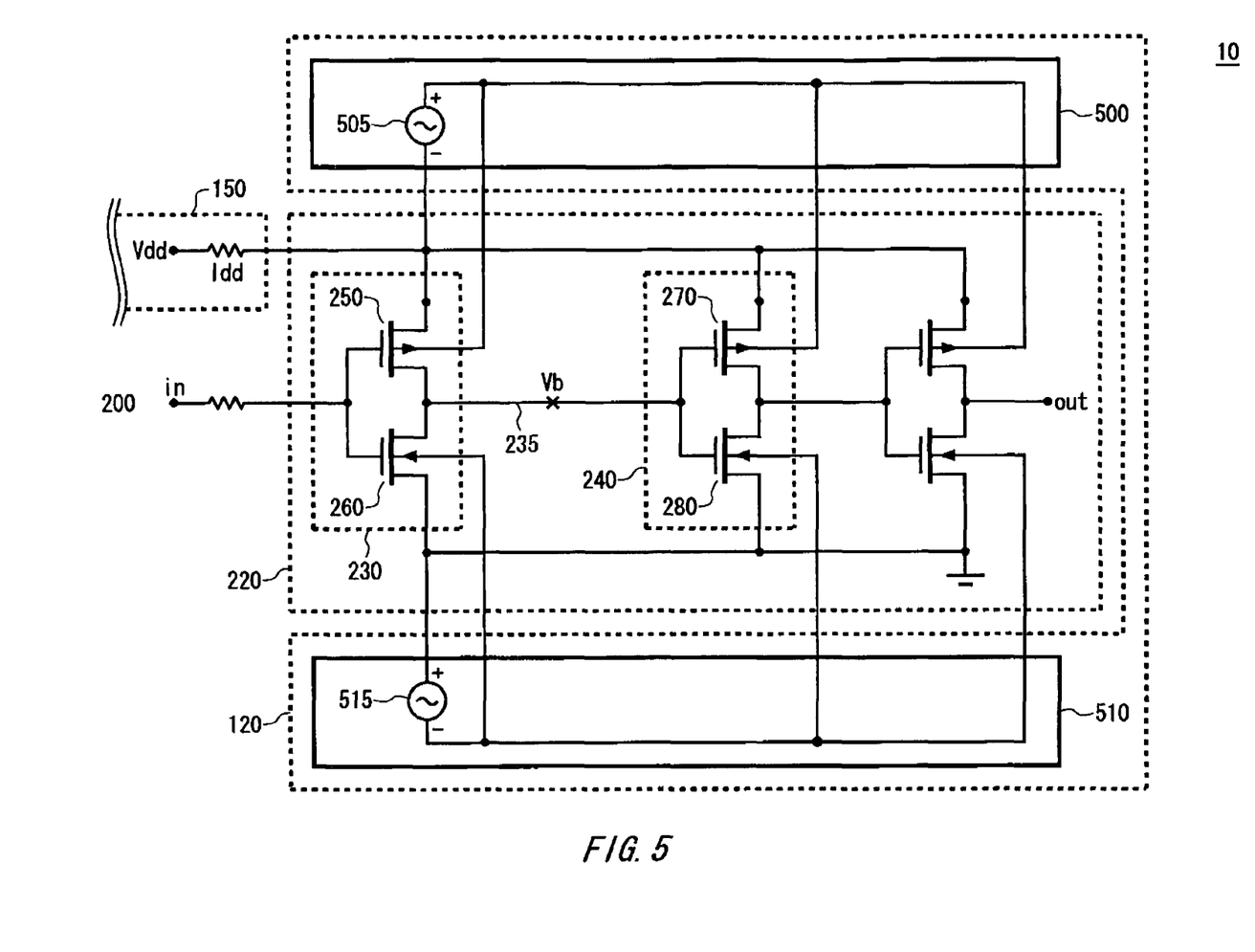
FIG. 5 shows a part of the configuration of the test apparatus 10 according to a modification of the embodiment of the present invention.

FIG. 5 shows a part of the configuration of the test apparatus 10 according to a modification of the embodiment of the present invention. In the test apparatus 10 according to the present modification, the power supply 110, the test signal supply unit 125, and the acceptability determination unit 160, which are not shown in the drawing, have generally the same functions and configurations as those shown in FIG. 1. Accordingly, description thereof will be omitted, except for the following points of difference.

The test signal supply unit 125 supplies a test signal to the DUT 100 so as to operate the downstream logic device component 240 at a certain frequency f, which is an example of the first frequency according to the present embodiment. Thus, the upstream logic device component 230 outputs a signal, which performs switching at the frequency f, to the downstream logic device component 240 via the signal propagation path 235.

On the other hand, the threshold voltage setting unit 120 according to the present modification varies the threshold voltages of the downstream logic device component 240, which is provided to the signal propagation path 235, at a certain frequency fv which is an example of the second frequency according to the present embodiment. The frequency fv may be lower than the frequency f. The threshold voltage setting unit 120 includes a VBBp modulation circuit 500 and a VBBn modulation circuit 510. The VBBp modulation circuit 500 includes a voltage modulation unit 505, and varies the substrate voltage on the P-channel side of the downstream logic device component 240 at the frequency fv. The VBBn modulation circuit 510 includes a voltage modulation unit 515, and varies the substrate voltage on the N-channel side of the downstream logic device component 240 at the frequency fv. With such an arrangement, the VBBp modulation circuit 500 and the VBBn modulation circuit 510 preferably vary the substrate voltage on the P-channel side and the substrate voltage on the N-channel side with phases that are inverse to one another.

The acceptability determination unit 160 determines whether or not the signal propagation path 235 is acceptable, based upon the amplitude of the frequency component of the fluctuation of the current consumption of the DUT 100 at a frequency corresponding to the frequency fv. As shown in FIG. 3, the through current flowing via the downstream logic device component 240, which is provided on the signal propagation path 235, changes dependent upon the change in the threshold voltages. With the present modification, the test apparatus 10 measures the current consumption of the DUT 100 while varying the threshold voltages at the frequency fv. This enables current consumption to be measured, which changes corresponding to the through current that changes at the frequency fv. Thus, the acceptability determination unit 160 can determine whether or not the signal propagation path 235 is acceptable, based upon the amplitude of the frequency component of the current consumption at a frequency corresponding to the frequency fv.

Figure 6:
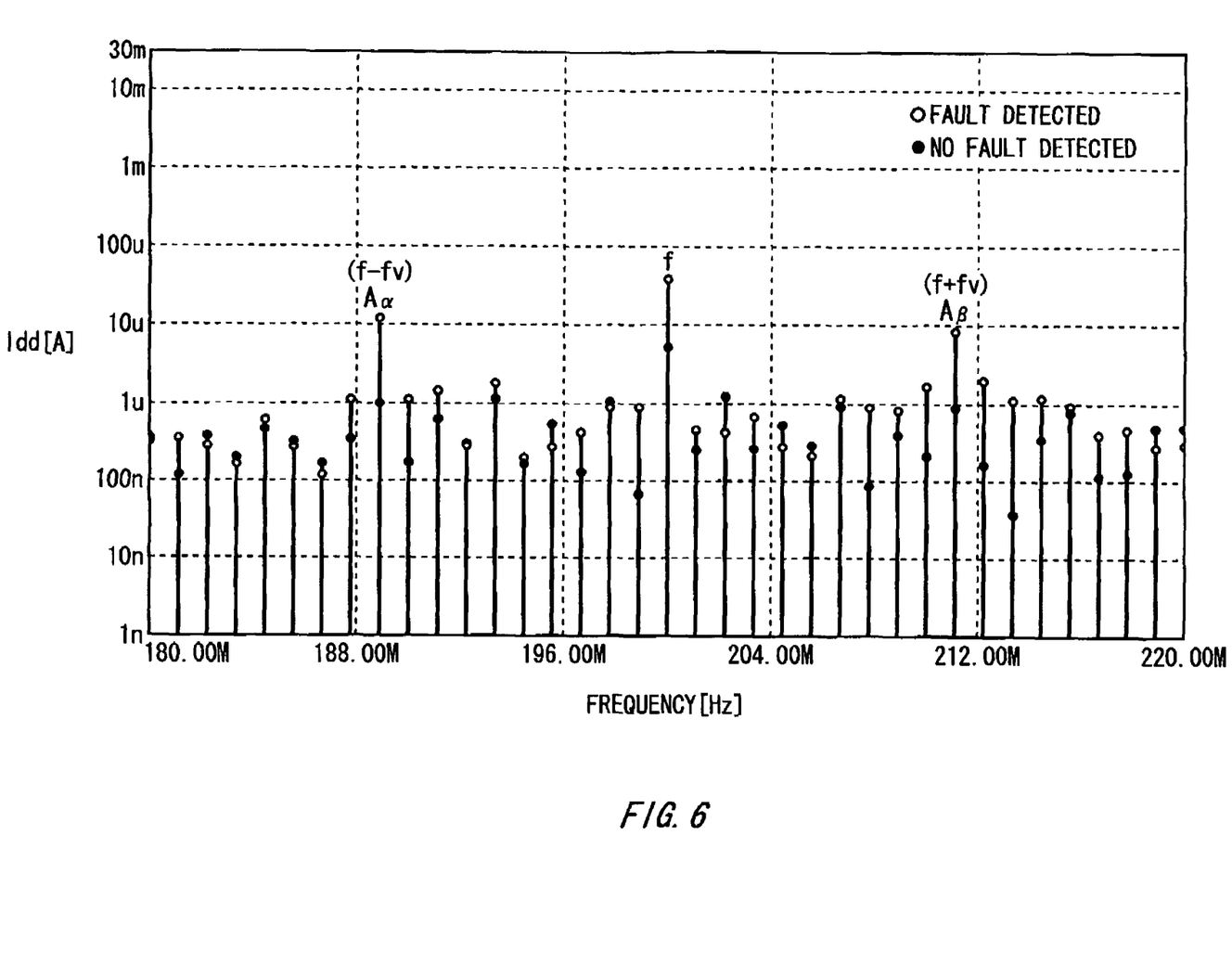
FIG. 6 shows an example of the frequency spectrum acquired by the test apparatus 10 according to the modification of the embodiment of the present invention.

FIG. 6 shows an example of a frequency spectrum acquired as a result of the operation of the test apparatus 10 according to the modification of the embodiment of the present invention. The acceptability determination unit 160 according to the present modification creates a frequency spectrum of the current consumption of the DUT 100, which has been measured by the current measurement unit 150. With the present modification, the test apparatus 10 instructs the downstream logic device component 240 to perform switching operation corresponding to an input signal at the frequency f while varying the threshold voltages of the downstream logic device component 240 at the frequency fv. Accordingly, the acceptability determination unit 160 obtains a frequency spectrum in which the magnitude of the fluctuation of the through current due to the fluctuation of the threshold voltages is modulated into the frequency components at frequencies f±fv. FIG. 6 shows an example of frequency spectrums in a case that delay faults have occurred, and in a case that delay faults have not occurred, both of which are measured at the frequency f of 200 MHz, and at the frequency fv of approximately 11 MHz.

As shown in FIG. 6, the delay faults occurring in the signal propagation path 235 manifest in the form of the amplitude Aα of the frequency component at a frequency obtained by adding the frequency fv to the frequency f, and the amplitude Aβ of the frequency component at a frequency obtained by subtracting the frequency fv from the frequency f. Accordingly, as an example, the acceptability determination unit 160 determines whether or not the signal transmission pathsignal propagation path is acceptable, based upon at least one of the amplitude Aα at the frequency f+fv, and the amplitude Aβ at the frequency f−fv. As an example, in a case that the amplitude Aα or Aβ is greater than a predetermined reference value, the acceptability determination unit 160 determines that delay faults have occurred in the signal propagation path 235.

With such an arrangement, the threshold voltage setting unit 120 may vary the threshold voltages of the multiple downstream logic device components 240, which are each provided to the multiple signal propagation paths 235 included within the DUT 100, at frequencies fv(k) (k=1, 2, ...), respectively, which differ from one another. This enables the acceptability determination unit 160 to obtain the magnitude of the fluctuation of the through current for each of the multiple downstream logic device components 240 in the form of the amplitude of the frequency component at the particular corresponding frequency in the frequency spectrum. Thus, the acceptability determination unit 160 can identify a particular one among the downstream logic device components 240 where delay faults have occurred, based upon the amplitude of each frequency component.

More specific description will be made. Let us consider a case in which a particular frequency component is greater than a predetermined reference value in the frequency spectrum which represents the fluctuation of the current consumption of the DUT 100. In this case, the acceptability determination unit 160 detects a particular one among the signal propagation paths 235 where the frequency of the aforementioned frequency component matches the sum of the frequency f and the frequency fv(k), at which the threshold voltages of the logic device component 240 corresponding to the signal propagation path 235 have been varied, or the difference obtained by subtracting the frequency fv(k) from the frequency f. Then, the acceptability determination unit 160 determines that the signal propagation path 235 thus detected, to be unacceptable.

Thus, the acceptability determination unit 160 can detect delay faults for multiple signal propagation paths 235 all at the same time, thereby providing a high-speed test.

While the present invention has been described thus by way of embodiments, the technical scope of the present invention is not restricted to the scope of the embodiments described above. Various modifications and improvements may be made to the above-described embodiments. It is to be clearly understood from the Claims that such modifications and improvements are also encompassed within the technical scope of the present invention.

For example, an arrangement may be made in which the test apparatus 10 measures current consumption of the DUT 100 while varying the threshold voltages for the entire region of the DUT 100, or for each of sub-regions thereof. Such an arrangement enables delay faults to be detected for each of the sub-regions where the threshold voltages have been varied.

Also, the test apparatus 10 may be provided within the DUT 10 as a BIST (built-in self test). With such an arrangement, the test apparatus 10 measures the current consumption of the DUT 100 while varying the threshold voltages of each of the logic device components included within the DUT 100, whereby the DUT 100 itself determines whether or not the DUT 100 is acceptable.

Also, according to the modification shown in FIG. 6, the acceptability determination unit 160 may determine whether or not the signal propagation path 235 is acceptable, based upon the amplitude of the frequency component of the fluctuation of the current consumption of the DUT 100 at the frequency fv.

As can be clearly understood from the above description, the present invention offers a test apparatus and a test method for properly detecting delay faults occurring in the signal propagation path included within the circuit.

What is claimed is:

1. A test apparatus for testing whether or not delay faults have occurred in a signal propagation path included within a test subject device, comprising:
   a threshold voltage setting unit for setting threshold voltages of a logic device component connected to said signal propagation path;
   a test signal supply unit for supplying a test signal to said test subject device so as to operate said logic device component provided to said signal propagation path in a state in which said threshold voltages have been set to first threshold voltages, and in a state in which said threshold voltages have been set to second threshold voltages, by said threshold voltage setting unit;
   a current measurement unit, for measuring a first operating current which is the current consumption of said test subject device in a case in which said logic device component operates in a state in which said first threshold voltages have been set, and for measuring a second operating current which is the current consumption of said test subject device in a case in which said logic device component operates in a state in which said second threshold voltages have been set; and
   an acceptability determination unit for determining whether or not said signal propagation path is acceptable, based upon said first operating current and said second operating current.

2. A test apparatus according to claim 1, wherein said threshold voltage setting unit changes and sets the substrate voltages of FETs (field effect transistors) included in said logic device component, thereby changing and setting the threshold voltages of said logic device component.

3. A test apparatus according to claim 1, wherein said threshold voltage setting unit sets said first threshold voltage and said second threshold voltages such that the absolute value of the difference between a level voltage, which is a signal input to said logic device component, and said second threshold voltage, is smaller than the absolute value of the difference between said level voltage and said first threshold voltage,
   and wherein, in a case that the difference obtained by subtracting said first operating current from said second operating current is greater than a predetermined reference value, said acceptability determination unit determines that said signal propagation path is unacceptable.

4. A test apparatus according to claim 3, wherein said threshold voltage setting unit sets said first threshold voltage to be the voltage used in the normal operation of said subject test device, and sets said second threshold voltage such that the absolute value of the difference between a level voltage, which is a signal input to said logic device component, and said second threshold voltage, is smaller than that in the normal operation.

5. A test apparatus according to claim 1, wherein said current measurement unit further measures a first quiescent current, which is the current consumption of said test subject device in a case that said logic device component does not operate in a state in which said first threshold voltages have been set, and a second quiescent current which is the current consumption of said test subject device in a case that said logic device component does not operate in a state in which said second threshold voltages have been set,
   and wherein said acceptability determination unit determines whether or not said signal propagation path is acceptable, based upon the difference between a first current difference, which is obtained by subtracting said first quiescent current from said first operating current, and a second current difference, which is obtained by subtracting said second quiescent current from said second operating current.

6. A test apparatus according to claim 5, wherein said threshold voltage setting unit sets said first threshold voltage and said second threshold voltage such that the absolute value of the difference between a level voltage, which is a signal input to said logic device component, and said second threshold voltage, is smaller than the absolute value of the difference between said level voltage and said first voltage,
   and wherein, in a case that the difference obtained by subtracting said first current difference from said second current difference is greater than a predetermined value, said acceptability determination unit determines that said signal propagation path is unacceptable.

7. A test apparatus according to claim 1, wherein said test signal supply unit supplies said test signal to said test subject device so as to operate said logic device component at a first frequency,
   and wherein said threshold voltage setting unit varies said threshold voltages at a second frequency,
   and wherein said acceptability determination unit determines whether or not said signal propagation path is acceptable, based upon the amplitude of the frequency component of the fluctuation of the current consumption of said test subject device at a frequency corresponding to said second frequency.

8. A test apparatus according to claim 7, wherein said acceptability determination unit determines whether or not said signal propagation path is acceptable, based upon at least one of the amplitude of the frequency component of the fluctuation of the current consumption of said test subject device at a frequency obtained by adding said second frequency to said first frequency, and the amplitude of the frequency component thereof at a frequency obtained by subtracting said second frequency from said first frequency.

9. A test apparatus according to claim 7, wherein said threshold voltage setting unit varies said threshold voltages of each of a plurality of said logic device components provided corresponding to a plurality of said signal propagation paths included within said test subject device, at second frequencies which differ from one another,
   and wherein, in a case that a particular frequency component in the frequency spectrum of the fluctuation of the current consumption of said test subject device is greater than a predetermined reference value, said acceptability determination unit determines that a particular one of said plurality of signal propagation paths, where the frequency of said frequency component matches the sum of said first frequency and said second frequency, at which the threshold voltages of said logic device component corresponding to said signal propagation path have been varied, or the difference obtained by subtracting said second frequency from said first frequency, is unacceptable.

10. A test method for testing whether or not delay faults have occurred in a signal propagation path included within a test subject device, comprising:
    a threshold voltage setting step for setting threshold voltages of a logic device component connected to said signal propagation path;
    a test signal supply step for supplying a test signal to said test subject device so as to operate said logic device component provided to said signal propagation path in a state in which said threshold voltages have been set to first threshold voltages, and in a state in which said threshold voltages have been set to second threshold voltages, by said threshold voltage setting unit;

a current measurement step, for measuring a first operating current which is the current consumption of said test subject device in a case in which said logic device component operates in a state in which said first threshold voltages have been set, and for measuring a second operating current which is the current consumption of said test subject device in a case in which said logic device component operates in a state in which said second threshold voltages have been set; and an acceptability determination step for determining whether or not said signal propagation path is acceptable, based upon said first operating current and said second operating current.

* * * * *